United States Patent [19]
Balliet, Jr. et al.

[11] Patent Number: 5,359,176
[45] Date of Patent: Oct. 25, 1994

[54] OPTICS AND ENVIRONMENTAL PROTECTION DEVICE FOR LASER PROCESSING APPLICATIONS

[75] Inventors: Clifford M. Balliet, Jr., Endicott; David E. Houser, Apalachin, both of N.Y.

[73] Assignee: International Business Machines Corporation, Armonk, N.Y.

[21] Appl. No.: 42,324

[22] Filed: Apr. 2, 1993

[51] Int. Cl.5 .............................................. B23K 26/14
[52] U.S. Cl. ............................ 219/121.84; 219/121.67
[58] Field of Search ...................... 214/121.84, 121.72, 214/121.67

[56] References Cited

U.S. PATENT DOCUMENTS

| | | | |
|---|---|---|---|
| 3,388,314 | 6/1968 | Gould | 219/121.6 X |
| 3,626,141 | 12/1971 | Daly | 219/121.84 X |
| 3,942,878 | 3/1976 | Engel et al. | 350/274 |
| 4,027,137 | 5/1977 | Liedtke | 219/121.84 X |
| 4,038,663 | 7/1977 | Day et al. | 219/121.84 X |
| 4,303,824 | 12/1981 | Morgan | 219/121.84 X |
| 4,347,785 | 9/1982 | Chase et al. | 219/121.84 X |
| 4,380,694 | 4/1983 | Dyson | 219/121.67 |

*Primary Examiner*—C. L. Albritton
*Attorney, Agent, or Firm*—Pollock, Vande Sande & Priddy

[57] ABSTRACT

An optics and environmental protection device for laser processing applications in which a laser processing assembly including a laser beam source is used to process a substrate. The laser processing assembly includes an optical focusing assembly including at least one lens located between the laser source and the substrate for focusing the laser beam on the substrate. The optics and environmental protection device includes a housing defining a chamber located between the optical focusing assembly and the substrate. The housing includes a first opening located adjacent to the optical focusing assembly for admitting the laser beam into the chamber, a second opening located adjacent to the substrate which allows the beam to exit the chamber, a third opening adjacent to which a source of pressurized gas is located, and a fourth opening adjacent to which a vacuum source is located. Pressurized gas and a vacuum source direct smoke, vapor, particles, and other debris produced by the laser processing away from the optical focusing assembly and the substrate and toward the fourth opening in the housing. The vacuum source also removes the smoke, vapor, and particles from the chamber.

25 Claims, 4 Drawing Sheets

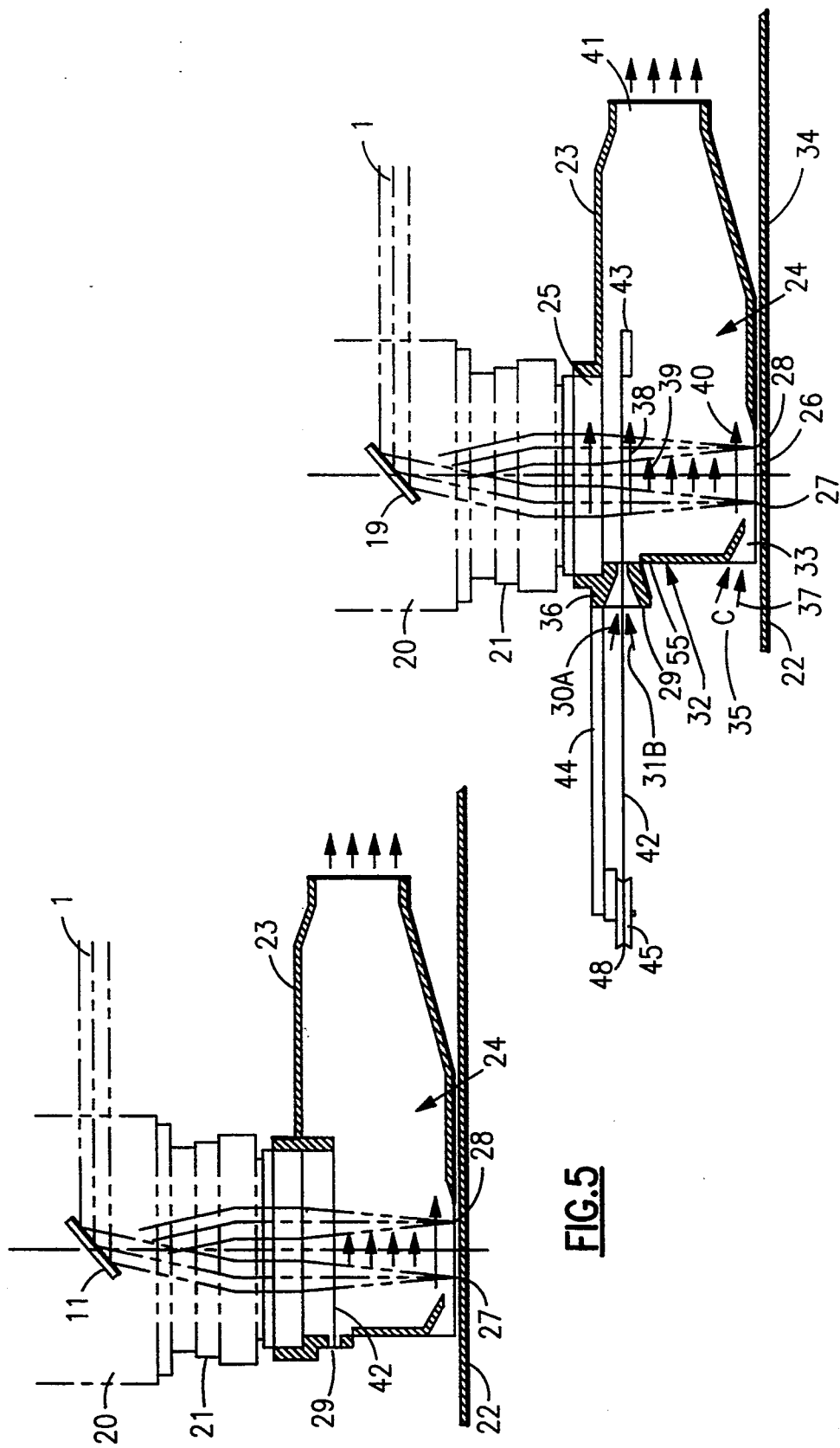

OPTICS AND ENVIRONMENTAL PROTECTION DEVICE FOR LASER PROCESSING APPLICATIONS

FIELD OF THE INVENTION

The present invention relates to a laser process apparatus for selectively removing material from a substrate using a laser beam. More particularly, the present invention relates to a device to protect an optical focusing assembly associated with the laser processing apparatus and to direct and remove smoke, particles, and other debris created by the process from the optical focusing assembly and the work area, and contain such smoke, particles, and debris thereby preventing them from entering the atmosphere.

BACKGROUND OF THE INVENTION

Lasers are used in a variety of fields for removing material from a substrate. Such applications include, among others, the use of lasers to write information onto an information storage medium and the formation of vias and other passages in circuit boards. The laser acts to remove material by burning and/or vaporization. Such a method allows for the very precise removal of material for the fabrication of a variety of components and devices.

However, laser processing suffers from the drawback of creating smoke and other debris including a variety of oxidation products and particulate matter which can litter and obscure the work surface as well as enter the atmosphere. Debris lying upon a work surface can obscure the work surface as well as interfere with the impact of the laser upon the work surface. Smoke and other debris passing into the atmosphere can create a health hazard as well as an environmental hazard. Further, flying debris can impact with the laser and/or associated optical apparatus thereby damaging it and adversely affecting its efficiency. Smoke and other debris can also absorb the laser energy thereby negatively affecting the beam's effectiveness.

Therefore, it is among the objects of the present invention to provide an apparatus which can remove smoke and other debris produced by a laser oblation apparatus thereby protecting the apparatus as well as to remove the debris and smoke from the work surface and the environment.

SUMMARY OF THE INVENTION

The present invention provides an optics and environmental protection device for laser processing applications. Such laser processing applications include a laser beam source used to process a substrate. The laser processing assembly also includes an optical focusing assembly having at least one lens located between the reflecting means and the substrate to focus the laser beam on the substrate.

The optics and environmental protection device of the present invention includes a housing defining a protection chamber, the housing being located between an optical focusing assembly and a substrate. The housing includes a first opening located adjacent to the optical focusing assembly admitting the laser beam into the chamber. A second opening is located adjacent to the substrate allowing the laser beam to exit the chamber. A third opening is provided, adjacent to which a source of pressurized gas is located.

A vacuum source is located next to a fourth opening. A source of pressurized gas is located adjacent the third opening in the housing. The pressurized gas directs smoke, vapor, particles, and other debris produced during the laser processing away from the optical focusing assembly and the substrate and toward the fourth opening if it is included in the housing. A vacuum source is located adjacent to the fourth opening in the housing. The vacuum source is for directing the smoke, vapor, particles and other debris away from the optical focusing assembly and the substrate toward the fourth opening in the housing and out of the chamber.

BRIEF DESCRIPTION OF THE DRAWINGS

FIG. 5 represents a cross sectional view of another embodiment of the present invention including a protective film.

FIG. 6 represents a cross-sectional view of an embodiment of the present invention including a protective film mounted on a film frame.

DETAILED DESCRIPTION OF VARIOUS AND PREFERRED EMBODIMENTS

Figure 1:
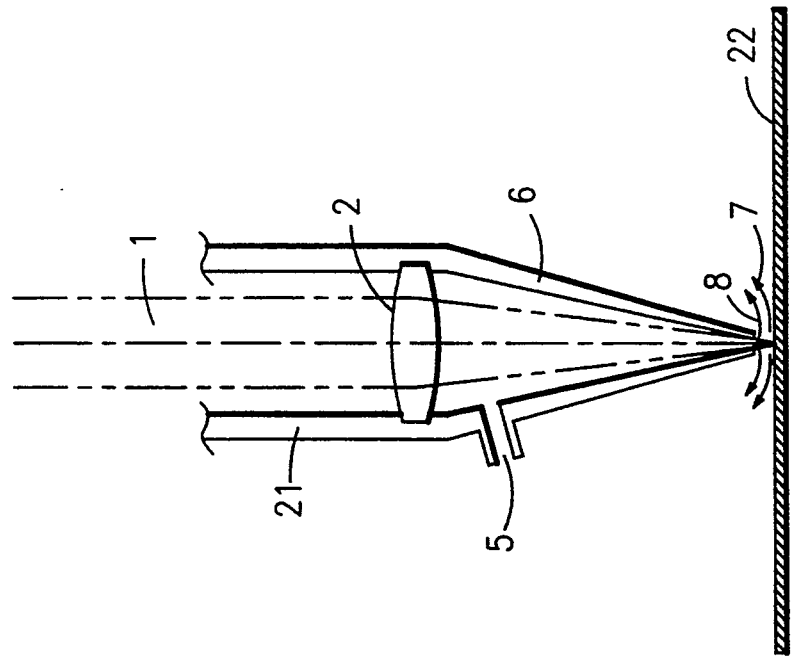
FIG. 1 represents a cross sectional view of the general design of a laser oblation device.

FIG. 1 shows a schematic cross section through a conventional "fixed beam" laser machining apparatus. A laser beam 1 produced by a source of laser light (not shown) may be directed towards an optical focusing assembly. Alternatively, the laser may be aimed directly at the substrate in the embodiment shown in FIG. 1, the optical focusing assembly 21 includes at least one lens 2. The focusing assembly 21 focuses the beam 1 on a specific area 4 on the substrate 22. The beam 1 must of sufficient strength that when focused by focusing assembly 21 it is intense enough to cause the vaporization or ablation of the substrate 22. In the fixed beam system shown in FIG. 1, the laser beam does not move relative to the optical focusing assembly; the beam and the optics move together relative to the substrate or the substrate moves relative to the laser beam and the optical focusing assembly to cause the beam address various different areas of the substrate. In this system, no provision is made to contain debris created by the laser acting on a substrate, to remove such debris from the work area, or to prevent the debris from impacting the optical focusing assembly or interfering with the effectiveness of the laser.

Figure 2:
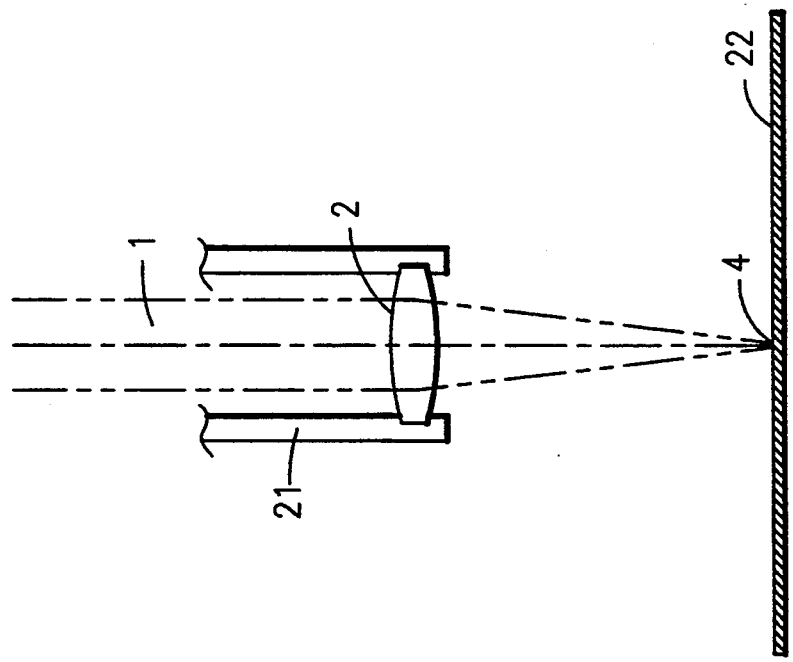
FIG. 2 represents a schematic cross sectional view of a conventional fixed beam laser machining apparatus.

FIG. 2 represents an improvement of the system seen in FIG. 1 in which the structure housing the beam and lenses has been extended toward the substrate in the form of a nozzle 6. The housing includes an opening 5 located between the optical focusing assembly 21 and the substrate through which air or another gas under pressure may be introduced. The gas may be introduced through the opening 5 and flows out of the housing through an exit opening 8 formed in the base of the nozzle 6.

The gas, flowing away from the object toward the opening at the base of the nozzle 6, acts on any debris flowing up into the nozzle toward the optical focusing assembly. The gas decelerates the debris, causing it to move away from the optics. The flow of the gas also moves the debris away from the work area in the directing of the arrows 7.

Because the laser is fixed in such prior art laser processing systems, the exit hole in a nozzle can be made relatively narrow thereby allowing high gas velocities to be obtained with relatively low flow rates. However, even after adding the nozzle and pressurized gas the fixed laser machining apparatus of FIG. 1, the problem of debris blown out of the nozzle still remains since there is no means to contain the debris and prevent contamination of the work area and the environment.

Such fixed beam laser processing systems are also limited in the speed with which they work since the entire laser and optical assembly or substrate must be moved each time a new area on the substrate is to be worked. Further, in a high power application, such a fixed beam nozzle would be prohibitively expensive for protecting the optics of a high power laser processing system because of the high gas flow rates which would be required by the limitation of exit hole size to the scanned area. Also, such a fixed beam nozzle seen in FIG. 2 would result in a scattering of large amounts of debris produced by a high power laser processing system producing unacceptable amounts of debris on the work area and in the environment. This would be unacceptable for most applications.

Figure 3:
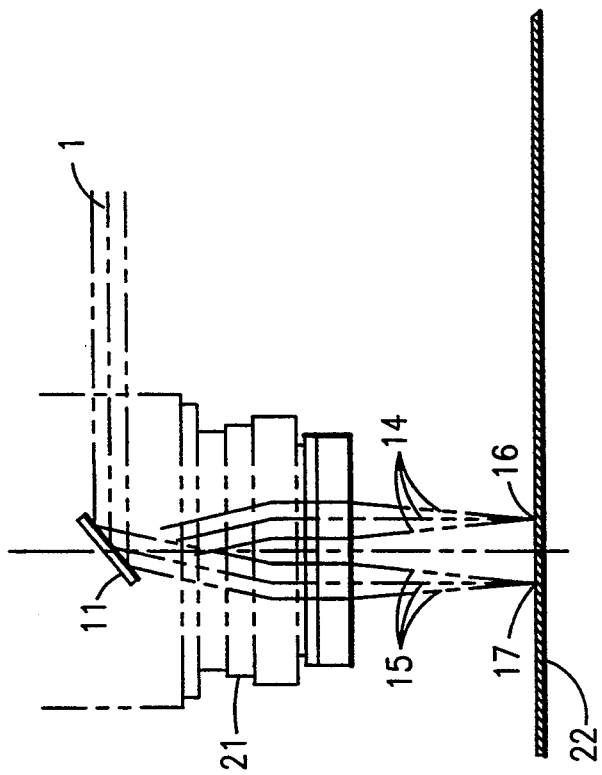
FIG. 3 represents an overhead cross sectional view of one embodiment of the present invention optics and environmental protection device.

To resolve the problems of slow processing speeds and relatively low power delivery inherent in fixed beam systems, the scanning laser processing system was developed. In a scanning system, as shown in FIG. 3, the laser beam is moved in relation to the focusing optics by a low inertia reflecting system. Such a scanning laser processing system generally includes a laser beam 1 generated by a laser beam source (not shown). The laser beam is directed towards at least one moveable scanning reflecting surface 11 which reflects the beam through the optical focusing assembly toward the work surface or substrate 22. The reflecting surface may be a mirror or any other material with or without a coating which reflects the particular wavelength of laser used.

As shown by the double sets of dotted lines 14 and 15, the laser beam may be directed to areas of the work surface of the substrate 22 by altering the position of the scanning reflecting surface(s) 11. One of greatest advantages of such a scanning laser processing system is that the speed with which the substrate may be processed is greatly increased since the entire apparatus may remain stationary while the scanning reflecting surfaces(s) shifts position, altering the path of the laser beam to allow the processing of different areas of the substrate. The amount of movement of the relatively large laser source and optic goal focusing components of the system is thereby reduced.

Most applications of such scanning laser processing systems have been relatively low power and low debris producing. Such applications include the use of scanning laser processing systems for laser printers, markers, and projectors among others. Recently, however, new applications for high power scanning laser processing systems have been developed. These high power applications include drilling and milling of, for example, circuit boards and cards. Such scanning laser processing systems have the potential to greatly reduce processing times over conventional processing means.

In comparison, a fixed laser beam processing system nozzle would become prohibitively expensive for protecting the optical focusing assembly objects of high power scanning system because of the high gas flow rates that would be necessary. In such a fixed beam nozzle, the exit hole is limited in size to the dimensions of the scanned area. Additionally, such a fixed beam nozzle would result in the scattering of large amounts of debris produced by high power, high speed scanning laser processing system. Such large amounts of debris would litter the work area, affect the efficiency of the laser beam, and be unacceptable in most applications.

The present invention provides effective and inexpensive means of protecting the optics in a high power laser scanning processing system. One embodiment of the present invention shown in FIG. 4 includes a laser source (not shown) producing the laser beam 1 directed towards at least one scanning reflecting surface 11. The scanning reflecting surface(s) may be located in a housing 20. An optical focusing assembly 21, including at least one lens, focuses the beam 1 onto the material to be processed. The optical focusing assembly 21 may be attached to the housing 20. The beam is focused upon the material to be processed 22.

Figure 4:
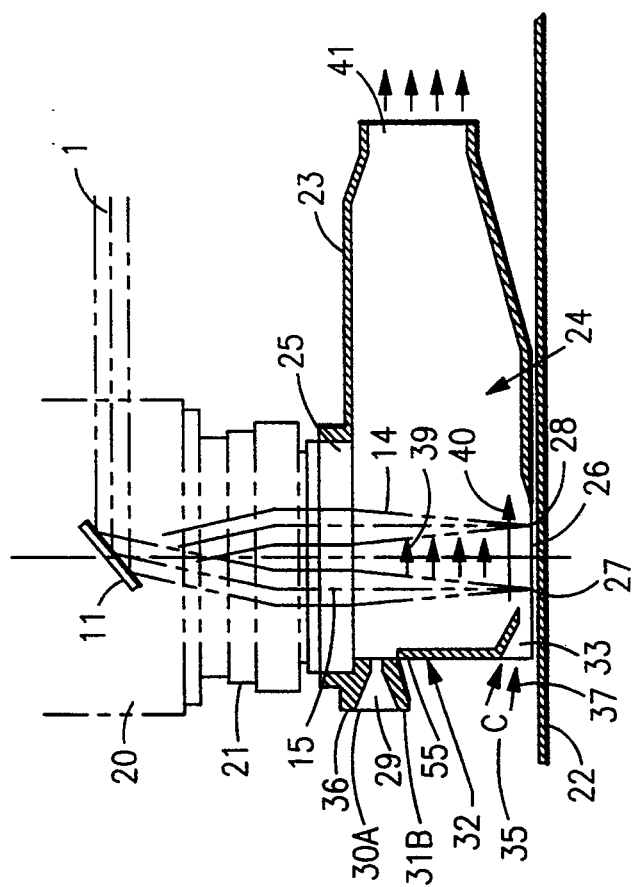
FIG. 4 represents a cross sectional side view of the embodiment of the present invention shown in FIG. 3.

The optics and environmental protection device of the present invention shown in FIG. 4 preferably includes a protection housing 23. The housing may be formed of any material capable of withstanding stray laser reflection. In one embodiment, the housing is formed from black anodized aluminum.

The housing 23 defines an inner protection chamber 24. The protection housing 23 preferably includes a first opening 25 for the laser beam to enter the chamber after first passing through the optical focussing assembly. The first opening 25 is generally shaped to closely surround the end of the optical focusing assembly thereby closing off that avenue of escape for airborne material produced by the laser ablating process. The protection housing preferably encloses a volume between the material to be processed 22 and the optical focusing assembly 21 such that the housing 23 extends from substantially near to the surface of the material to be processed 22 toward the focusing assembly and the volume surrounding the laser beam.

A second opening 26 formed in the protector housing 23 adjacent to the material to be processed 22 is approximately the size of the area which is addressable by the laser beam by moving only the scanning mirror. As seen in FIG. 4, by altering the position of the reflecting surface 11, the point of intersection of the beam, indicated by the dotted lines, with the material 22 extends between points 27 and 28. The beam may also extend between about an area on both sides of the cross-sectional plane shown in FIG. 4.

A third opening 29 formed in the side wall of the protector housing 23 may be included in the protection housing to provide an inlet for pressurized gas. The pressurized gas flows into the protection housing 23 into the chamber 24 to direct smoke, debris and particles away from the optical focusing assembly. Flow concentrators 30 and 31 may be located at points A and B, respectively, to increase the air velocity into the chamber providing additional force to prevent debris from impacting and potentially damaging the optical focussing assembly. Although the embodiment shown in FIG. 4 includes two such flow concentrators, any number of such flow concentrators may be used. In fact, if desired, the flow concentrators need be eliminated from the design of the present invention.

The speed of the gas flowing into the chamber varies, depending upon the particular application and apparatus design. In one embodiment, a gas flow of 300 feet per second was used. One requirement for the gas flow is that it be strong enough to divert any stray particles or debris away from the optics. Preferably, the gas flow rate is set to function with the maximum power requirement of the particular embodiment.

To provide additional source of gas flow into the chamber 24, a porous plate 32 may be inserted in the wall of the housing 23. The porus plate 32 preferably includes a plurality of pores 55. The plate preferably is made of metal but may be constructed of any material capable of withstanding stray laser reflections and the conditions such as heat generated by the drilling process.

Further, the material preferably should not burn or melt if impacted by debris from the drilling. Also, the structural integrity of the material should be maintained even with enough pores formed through it to properly increase the air flow.

In addition to the gas flow inlets 29 and 32, a gas flow inlet 33 may be provided at the base of the housing near the work surface 34 of the material 22. The inlet 33 provides air flow over the work surface thereby helping to prevent the settling and build up of debris on the work surface as well as to divert the debris away from a path toward the optical focusing assembly. One or more flow concentrators 35 may be provided at point C to maintain a high air velocity near the work surface and gas flow over the work surface.

Gas may be introduced into the chamber 24 at points 29, 32, and 33 not only to direct gas, particles, and other debris away from the objects and the work surface, but also to cool the chamber and the work surface as well as the optics. Along these lines, means may be included in the present invention to introduce nitrogen into the gas flowing through the openings 29, 32 and 33 to provide a cooling effect to the gas flowing into the inlets. The direction of gas flow into and through the chamber 24 is indicated by arrows 36, 37, 38, 39 and 40. Gas flowing into the chamber may also hold to direct gas, particles, and other debris created by drilling out of the protection chamber 24 through an exit opening.

In addition to the gas directed into the chamber 24, the present invention may include a vacuum source (not shown) connected to a fifth opening 41 provided in the wall of the protection housing 23. Preferably, when attached to the present invention, the vacuum pump increases air flow into and through the chamber 24. This increase in air flow will further aid in preventing debris from impacting with the optical focusing assembly 21, assist in cooling elements of the assembly, and also help remove smoke particles and other debris created by the laser processing procedure. Such smoke, particles and debris will be sucked away from where they are created, at the point where the laser beam impacts on the material 22, and are drawn through the chamber 24 and out of the housing 23 through the opening 41 into receiving means (not shown).

Additional means which may be included with the present invention to further protect the optical focusing assembly may include, as seen in FIG. 5, a thin polymer film 42 located between the optical focusing assembly 21 and the material being processed 22. Preferably, the film 42 is thin polymer film which may be made of any polymer which has a low absorbency for the particular laser wavelength being used to process the material 22 and is capable of withstanding the particular wavelength of laser light employed in the particular process. In one embodiment, polyethylene was used as the film material. The film is particularly useful to protect the optics from hot, high mass, high velocity particles such as molten metal droplets that can be produced by laser ablation of the substrate 22.

Preferably, the film is mounted on a film frame and enters the chamber 24 through the opening 29. This opening may also serve as a gas inlet as described above. Preferably, as seen in FIG. 6, the film and film frame 43 are mounted on a film and film frame support 44. The film and film frame support 44 preferably includes at least one spring loaded guide roller 45 mounted on the film and film frame support 44 which is attached to the protection housing 23.

Figure 7:
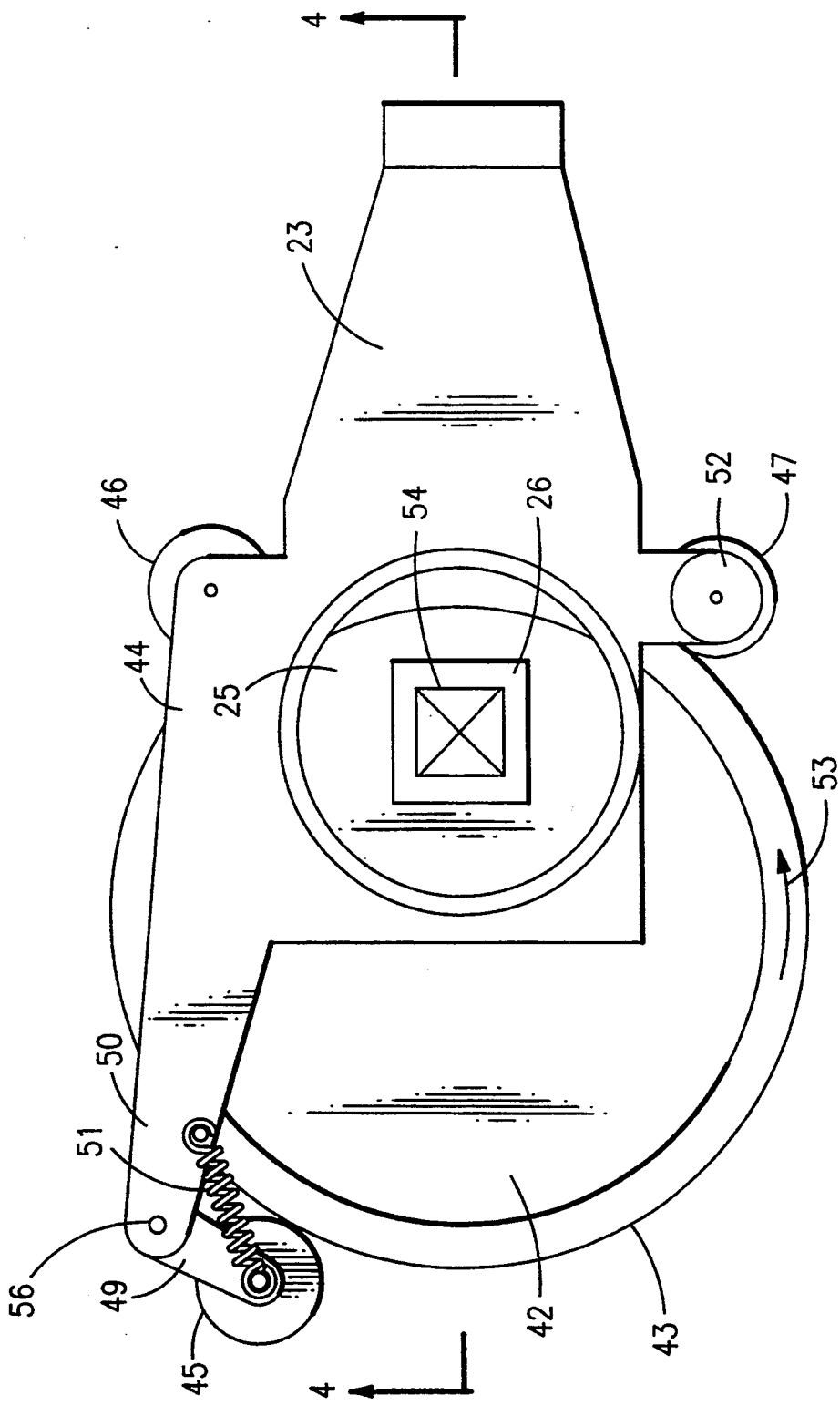
FIG. 7 represents an overhead view of the embodiment of the present invention seen in FIG. 6.

As seen from above in FIG. 7, the film and film frame support 44 is attached to the protector housing 23. The film 42 and film frame 43 are supported in the support by at least one spring-loaded guide roller 45, at least one guide roller 46, and at least one drive roller 47. As seen in cross section in FIG. 6, all the rollers preferably include a receiving groove 48 designed to engage the edge of the film frame 43. As seen in FIG. 7, the spring-loaded guide roller 45 includes an articulating arm 49 attached to a spring-loaded guide roller extension 50 extending from the film and film frame support 44. The spring-loaded guide roller 45 is urged into contact with the film frame by a spring 51. In this configuration, with the spring-loaded guide roller engaging a film frame opposite the guide roller and the drive roller, the film frame is urged into contact with the guide roller and drive roller.

The film and film frame may be caused to rotate by the drive motor 52 attached to the drive roller 47. The film and film frame rotate in the direction indicated by the arrow 53. During the laser processing of the material 22, to reduce the film heat loading and to provide additional opportunity for cooling components of the assembly, the film may be continuously moved by the drive motor. The film speed may be adjusted to the particular application to minimize heat load per unit area. In preferred embodiments, the film rotates at a speed of from about 0–1500 revolutions per minute. However, the film may rotate at any speed which allows the film to withstand the repeated illumination by the laser.

In alternative embodiment, the film could be moved in a linear fashion by a roll-to-roll system or by a continuous film belt system. In this alternative embodiment, the linear film speed preferably matches the rotational speed of the film disk. In the embodiment shown in FIG. 5, the film rolls could be located on both sides of the cross-sectional plane and the film could move linearly on from one side to the other of the cross-sectional plane.

The spring-loaded roller provides easy change of the film and frame assembly in a minimum amount of time. As seen in FIG. 7, the spring-loaded guide roller arm 49 is rotated about its point of attachment 56 in a clockwise direction. The film and film support may then be simply removed and a new one inserted. The spring-loaded roller is then allowed to move into engagement with the frame by the action of the spring.

The film may be changed when it becomes non-functional because the film no longer transmits the laser light, upon the formation of holes in the film, or upon the build up of debris on the film to the point that the film no longer allows the laser light to pass. The number of laser blasts which a particular film may withstand depends upon the composition of the film and the application involved. With some applications, the film has withstood over 350,000 hits by the laser.

As seen in FIG. 7, the area of the substrate 22 addressable by the scanner is indicated by the square 54. This area represents the area of the material which may be scanned simply by moving the scanning mirror(s). The opening 26 in the protector housing 23 closely surrounds the scanable area to minimize the scattering of debris on the work surface as well as to prevent smoke, particles and other debris from entering the atmosphere. The first opening 25 in the protector housing 23 may also be seen in FIG. 7.

As seen in FIGS. 4 and 6, additional cooling may be provided by the flow concentrators 30 and 31 which may be located on opposite sides of the film. Additional flow concentrators may be located about the opening 29 into which the film may be inserted. The gas flow into the chamber 24 as well as the vacuum source removing air from the chamber in addition to removing smoke, particles and other debris, serves to remove the debris to keep the area between the optics and the work area clear so that a minimum amount of the laser beams energy will be absorbed by the debris. The vacuum source helps to assure that all debris produced by the laser processing is contained to prevent contamination of the machine environment.

In addition to the gas flow and vacuum source, the present invention may include an ionizer (not shown) mounted adjacent the film surface not covered by the film and film frame support 44 or the optical focusing assembly and protector housing 23 as seen in FIG. 6. The ionizer helps to prevent static build up and therefore particle build up on the film. The nitrogen which may be introduced into the gas flowing into the chamber as discussed above may also help to aid the cooling of the film.

In one embodiment of the present invention, a 1,500 watt $CO_2$ laser scanning system was used for forming holes and blind holes for printed circuit boards. The film used for this particular application is 1.3 mil thick polyethylene which absorbs approximately 4% of the beam's energy and reflects approximately 8%. This embodiment has been employed to form approximately 100 and 200 holes per second with 6.4 and 0.7 joules/laser strike respectively.

This is just one embodiment of the present invention, and the present invention is not limited to the above-stated laser wavelength, film thickness and/or material, or hit rate or energy per laser strike. Any type and power of laser may be used in the present invention with any laser wavelength for whatever purpose the present invention is used and if a film is used, if a functional film may be found. In one embodiment, a $CO_2$ laser was used.

Additionally, any type of material may be used to form a film or to which minimizes absorbency and reflectivity of the film to the particular laser power and wavelength used. Additionally, any hit rate and energy per hit may be used. This system has also been used for among other things, opening up "windows" in the top dielectric layer on printed circuit boards and cards, including high density circuit boards as well as for drilling through and blind holes in high density circuit boards. The system has also been used to process, among other materials, copper, TEFLON, and FR4 epoxy resin impregnated glass cloth.

We claim:

1. An optics and environmental protection device for laser processing applications in which a laser processing assembly including a laser beam source producing a laser beam is used to process a substrate, said laser processing assembly also including an optical focusing assembly including at least one lens located between said laser source and said substrate for focusing said laser beam on said substrate, said optics and environmental protection device comprising:

a housing defining a chamber, said housing being located between said optical focusing assembly and said substrate, said housing including a first opening located adjacent to said optical focusing assembly and for admitting said laser beam into said chamber, a second opening located adjacent to said substrate for allowing said beam to exit said chamber, a third opening adjacent to which a source of pressurized gas is located, and a fourth opening adjacent to which a vacuum source is located, wherein said pressurized gas directs smoke, vapor, particles, and other debris produced by said laser processing away from said optical focusing assembly and said substrate and toward said fourth opening in said housing and said vacuum source directs said smoke, vapor, particles and other debris away from said optical focusing assembly and said substrate, toward said fourth opening in said housing and removes them from said chamber, said pressurized gas and said vacuum source creating a crossflow through said chamber.

2. The optics and environmental protection device according to claim 1, wherein said housing is made of anodized aluminum.

3. The optics and environmental protection device according to claim 1, wherein said pressurized gas flows up to 300 feet per second.

4. The optics and environmental protection device according to claim 1, wherein said apparatus is used to drill up to 200 holes per second.

5. The optics and environmental protection device according to claim 1 also including means to receive and contain said smoke, vapor, and particles removed from said chamber.

6. The optics and environmental protection device according to claim 1, wherein said housing includes at least one wall having perforations formed therethrough for increasing gas flow into said chamber.

7. The optics and environmental protection device according to claim 1, wherein said housing includes a fifth opening and wherein a plate including a plurality of perforations formed therein is placed within said opening.

8. The optics and environmental protection device according to claim 7, wherein said plate is made of a material capable of withstanding stray laser reflections.

9. The optics and environmental protection device according to claim 8, wherein said plate is made of metal.

10. The optics and environmental protection device according to claim 1, wherein said housing includes a fifth opening located adjacent said second opening for increasing gas flow over said substrate adjacent where said laser beam is focused on said substrate.

11. The optics and environmental protection device according to claim 10, wherein at least one flow concentrator is placed adjacent said third opening to increase the flow of gas into said housing and at least one flow concentrator is placed adjacent said fifth opening in said housing.

12. The optics and environmental protection device according to claim 10, wherein said fifth opening is formed from an upward deformation of an edge of said second opening in said housing, said fifth and said second openings being continuous.

13. The optics and environmental protection device according to claim 1, wherein a thin polymer film is placed in the vicinity of said optical focusing assembly between said laser source and said substrate for preventing particles and debris produced by said laser processing from impacting with said optical focusing assembly.

14. The optics and environmental protection device according to claim 13, wherein said film is polyethylene.

15. The optics and environmental protection device according to claim 13, wherein said film is capable of withstanding up to 350,000 hits by said laser.

16. The optics and environmental protection device according to claim 13, wherein said thin polymer film is mounted on a film frame, said film frame being supported on a film and film frame support mounted on said housing.

17. The optics and environmental protection device according to claim 16, wherein said film is polyethylene.

18. The optics and environmental protection device according to claim 16, wherein:

said film is a substantially circular sheet;

said film frame is substantially circular and is rotatably mounted on said film support;

said film support including a plurality of rollers including at least one each fixed guide roller, motorized drive roller, and spring-loaded guide roller, such that said film frame is movably engaged by said rollers, whereby said film at least partially extends into an opening in said protection housing.

19. The optics and environmental protection device according to claim 18, wherein said film and film frame rotate up to 1500 revolutions per minute.

20. The optics and environmental protection device according to claim 16, wherein said opening into which said film extends is said third opening in said chamber.

21. The optics and environmental protection device according to claim 16, wherein at least one flow concentrator is located adjacent said film for increasing gas flow into said housing and over said film.

22. The optics and environmental protection device according to claim 13, wherein said film moves linearly through the path of said laser beam.

23. The optics and environmental protection device according to claim 1, wherein said cross-flow is created in at least a portion of the space between said first and second openings in said chamber over an area at least substantially as large as said second opening.

24. The optics and environmental protection device according to claim 13, further comprising means for cooling said film.

25. The optics and environmental protection device according to claim 24, wherein said cooling means comprises at least one flow concentrator located adjacent said film.

* * * * *